(12) United States Patent
Zhang et al.

(10) Patent No.: US 11,091,829 B2
(45) Date of Patent: Aug. 17, 2021

(54) METAL MASK, METAL MASK PLATE AND METHOD OF MANUFACTURING THE SAME

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Jian Zhang, Beijing (CN); Chunchieh Huang, Beijing (CN); Zhiming Lin, Beijing (CN); Zhen Wang, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 138 days.

(21) Appl. No.: 16/179,455

(22) Filed: Nov. 2, 2018

(65) Prior Publication Data
US 2019/0301001 A1 Oct. 3, 2019

(30) Foreign Application Priority Data
Mar. 30, 2018 (CN) .......................... 201810276313.8

(51) Int. Cl.
*C23C 14/04* (2006.01)
*H01L 51/00* (2006.01)

(52) U.S. Cl.
CPC ........ *C23C 14/042* (2013.01); *H01L 51/0011* (2013.01)

(58) Field of Classification Search
CPC ..... C23C 14/042; C23C 14/24; B05C 21/005; B05C 17/06; H01L 51/0011; B23K 31/00; B05D 1/32
USPC .......................................... 118/504, 505, 721
See application file for complete search history.

(56) References Cited

U.S. PATENT DOCUMENTS

| | | | |
|---|---|---|---|
| 6,955,726 B2 * | 10/2005 | Kang | .................... C23C 14/042 118/504 |
| 9,847,485 B2 | 12/2017 | Min | |
| 2003/0221614 A1 | 12/2003 | Kang et al. | |
| 2011/0179996 A1 | 7/2011 | Park et al. | |

(Continued)

FOREIGN PATENT DOCUMENTS

| | | |
|---|---|---|
| CN | 1471341 A | 1/2004 |
| CN | 102140619 A | 8/2011 |
| CN | 106480404 A | 3/2017 |

OTHER PUBLICATIONS

First Office Action issued in corresponding Chinese Application No. 201810276313.8, dated Sep. 18, 2019, with English language translation.

*Primary Examiner* — Laura Edwards
(74) *Attorney, Agent, or Firm* — McDermott Will and Emery LLP

(57) ABSTRACT

A metal mask includes a mask body part and two connecting parts disposed at opposite sides of the mask body part. Each of the connecting parts includes a body portion and a single-stage step portion. A side of the body portion is connected to the mask body part, and an opposite side of the body portion is connected to the single-stage step portion. A thickness of the single-stage step portion is smaller than a thickness of the body portion.

9 Claims, 8 Drawing Sheets

(56) References Cited

U.S. PATENT DOCUMENTS

2011/0207261 A1\* 8/2011 Watai .................. C23C 14/56
　　　　　　　　　　　　　　　　　　　　　　　438/98
2014/0150721 A1\* 6/2014 Oh .................. H01L 51/0011
　　　　　　　　　　　　　　　　　　　　　　　118/504

\* cited by examiner

A-A

B-B

METAL MASK, METAL MASK PLATE AND METHOD OF MANUFACTURING THE SAME

CROSS-REFERENCE TO RELATED APPLICATION

This application claims priority to Chinese Patent Application No. 201810276313.8, filed on Mar. 30, 2018, titled "A METAL MASK, METAL MASK PLATE AND METHOD OF MANUFACTURING THE SAME", which is incorporated herein by reference in its entirety.

TECHNICAL FIELD

The present disclosure relates to the field of evaporation technologies, and in particular, to a metal mask, a metal mask plate and a method of manufacturing the same.

BACKGROUND

At present, in the process of manufacturing a display panel, functional film layers in the display panel are usually manufactured through respective evaporation processes. For example, in the process of manufacturing an organic light-emitting diode (OLED) display panel, organic light-emitting layers of OLED devices in the OLED display panel are usually formed through respective evaporation processes. When using an evaporation process to manufacture some of the functional film layers in the display panel, a mask plate having a pattern corresponding to these functional film layers is usually adhered to a side of a substrate of the display panel on which an evaporation material will be deposited, and the mask plate and the substrate are placed above an evaporation source. Then, the evaporation material in the evaporation source is heated to form vapor, which will reach the substrate and be deposited on the substrate to form the functional film layers.

SUMMARY

In an aspect, a metal mask is provided. The metal mask includes a mask body part and two connecting parts disposed at opposite sides of the mask body part. Each of the connecting parts includes a body portion and a single-stage step portion, a side of the body portion is connected to the mask body part and an opposite side of the body portion is connected to the single-stage step portion. A thickness of the single-stage step portion is smaller than a thickness of the body portion.

In some embodiments, the single-stage step portion includes a step surface perpendicular to a thickness direction of the metal mask.

In some embodiments, step surfaces of the two connecting parts of the metal mask are disposed facing opposite directions in a thickness direction of the metal mask.

In some embodiments, step surfaces of the two connecting parts of the metal mask are disposed facing a same direction in a thickness direction of the metal mask.

In some embodiments, a height of the single-stage step portion in a thickness direction of the metal mask is one third to two thirds of a thickness of the mask body part.

In some embodiments, a width of each connecting part is 0.5 mm to 3 mm.

In another aspect, a metal mask plate is provided. The metal mask plate includes a frame and a plurality of metal masks. A middle region of the frame is a hollow region, each metal mask spans across the hollow region of the frame in a first direction, and two ends of each metal mask along the first direction are connected to the frame. The plurality of metal masks are sequentially arranged in a second direction, and any two adjacent metal masks are directly connected, so that there is no gap between any two adjacent metal masks. The first direction and the second direction intersect each other.

In some embodiments, each metal mask is the metal mask according to the above aspect, and step surfaces of connecting parts of any two adjacent metal masks are partially overlapped and connected to each other.

In some embodiments, the single-stage step portion comprises a step surface perpendicular to a thickness direction of the metal mask.

In some embodiments, of the plurality of metal masks, step surfaces of two connecting parts of each of a part of the metal masks are disposed facing a same direction in a thickness direction of the metal mask, and step surfaces of two connecting parts of each of remaining metal masks are disposed facing opposite directions in the thickness direction of the metal mask.

In some embodiments, in the second direction, of the plurality of metal masks, step surfaces of two connecting parts of a single metal mask in a middle of the hollow region are disposed facing a same direction in the thickness direction of the metal mask, and step surfaces of two connecting parts of each of remaining metal masks are disposed facing opposite directions in the thickness direction of the metal mask. In the second direction, from the middle to both sides of the hollow region, of any two adjacent metal masks, a step surface of a connecting part of a metal mask close to a side of the hollow region is placed on a step surface of a connecting part of a metal mask close to the middle of the hollow region.

In some embodiments, step surfaces of two connecting parts of each metal mask are disposed facing opposite directions in the thickness direction of the metal mask.

In some embodiments, step surfaces of two connecting parts of each metal mask are disposed facing a same direction in the thickness direction of the metal mask.

In some embodiments, the single-stage step portion of the connecting part further includes a rear end close to and connected to the body portion and a front end away from the body portion, and there is a gap between the a front end of any one of the connecting parts and a rear end of a connecting part of a metal mask adjacent to the connecting part.

In some embodiments, a width of an overlapping area between a step surface of any connecting part and a step surface of a connecting part of a metal mask adjacent to the connecting part is 20% to 80% of a width of the connecting part.

In some embodiments, in the second direction, a side surface of any one of the metal masks is opposite to and connected to a side surface of a metal mask adjacent to the side surface.

In some embodiments, in the first direction, the metal mask includes at least two mask pattern regions and at least one invalid mask region, each invalid mask region is provided between two adjacent mask pattern regions of the metal mask. The metal mask plate further includes at least one howling for supporting the plurality of metal masks, and each howling spans across the hollow region of the frame along the second direction and corresponds to a corresponding one of the at least one invalid mask region.

In some embodiments, a material of the frame, a material of the at least one howling and a material of the metal masks are all Invar alloy.

In some embodiments, a thickness of the metal mask is 20 µm to 150 µm.

In yet another aspect, a method of manufacturing the metal mask plate as described in the above aspect is provided, and the method includes:

placing each of a plurality of metal masks across the hollow region of the frame in a first direction, during which the plurality of metal masks are sequentially arranged in a second direction, and any two adjacent metal masks are directly connected, so that there is no gap between any two adjacent metal masks, wherein the first direction and the second direction intersect each other.

In some embodiments, each metal mask includes two opposite connecting parts, and the two connecting parts are located on both sides of the mask body part of the metal mask in the second direction; each connecting part includes a body portion and a single-stage step portion, a side of the body portion is connected to the mask body part and an opposite side of the body portion is connected to the single-stage step portion; the single-stage step portion includes a step surface perpendicular to a thickness direction of the metal mask, and step surfaces of connecting parts of any two adjacent metal masks are partially overlapped and connected to each other; and in the second direction, from a middle to both sides of the hollow region, of any two adjacent metal masks, a step surface of a connecting part of a metal mask close to a side of the hollow region is placed on a step surface of a connecting part of a metal mask close to the middle of the hollow portion.

Based on this, placing each of the plurality of metal masks across the hollow region of the frame in a first direction, during which the plurality of metal masks are sequentially arranged in a second direction, and any two adjacent metal masks are directly connected, includes:

placing a single metal mask that is located in the middle of the hollow region across the middle of the hollow region in the first direction, and connecting two ends of the metal mask along the first direction to the frame, wherein step surfaces of two connecting parts of the metal mask are disposed facing a same direction in a thickness direction of the metal mask; and in the second direction, from the middle to both sides of the hollow region, sequentially arranging remaining metal masks across the hollow region in the first direction, during which a step surface of a connecting part close to the middle of the hollow region in a metal mask and a step surface of a corresponding connecting part in a metal mask adjacent to the connecting part are partially overlapped and connected, and two ends of the metal mask along the first direction are connected to the frame.

BRIEF DESCRIPTION OF THE DRAWINGS

The accompanying drawings described herein are intended to provide a further understanding of the present disclosure and constitute a part of the present disclosure. The illustrative embodiments of the present disclosure and the description thereof serve to explain the present disclosure, but do not constitute an undue limitation of the present disclosure. In the accompanying drawings:

FIG. 1b is a cross-sectional view taken along line O-O of FIG. 1a;

FIG. 14 is a flow chart of step S2 of FIG. 13a.

DETAILED DESCRIPTION

Figure 1A:
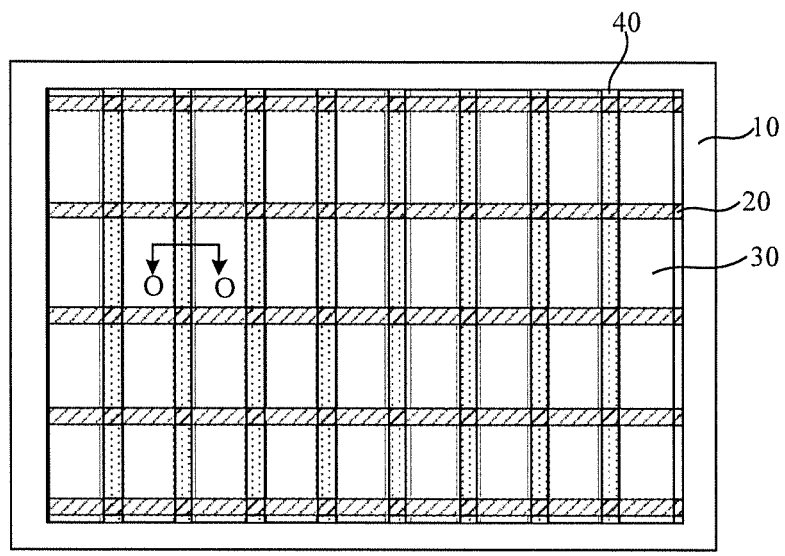
FIG. 1a is a schematic diagram of a metal mask plate in the related art.

In the evaporation process, the mask plate adopted is usually a metal mask plate. As shown in FIG. 1a, the metal mask plate usually includes a frame 10, a plurality of howlings 20, a plurality of covers 40, and a plurality of metal masks 30. A middle region of the frame 10 is a hollow region, that is, a plan view of the frame 10 is like a hollow rectangle. Two ends of each of the howlings 20 and two ends of each of the covers 40 are respectively embedded in grooves in the frame 10, and are fixedly connected to the frame 10. The plurality of howlings 20 and the plurality of covers 40 are disposed to intersect each other, dividing the hollow region of the frame 10 into a plurality of sub-regions arranged in an array. The howlings 20 are located on the covers 40. Each metal mask 30 spans across the hollow region of the frame 10 in a length direction of the covers 40, and the plurality of metal masks 30 are sequentially arranged in a length direction of the howlings 20. The howlings 20 are used for supporting the metal masks 30, and one of the plurality of covers 40 corresponds to an area between any two adjacent metal masks 30, and is used for shielding a gap between any two adjacent metal masks 30.

In a case where the metal mask plate as shown in FIG. 1a is used in an evaporation device to form a functional film layer on a substrate, the metal mask plate is overlaid on a side of the substrate on which an evaporation material will be deposited, and the overlapped substrate and metal mask plate are placed above the evaporation source with the metal mask plate located below the substrate. Then, the metal mask plate is adsorbed by a magnetic adsorption device above the substrate, so that the metal mask plate is attached to the substrate.

Figure 1B:
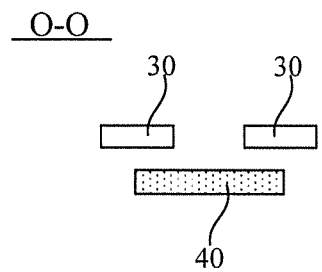

However, since the covers 40 and the howlings 20 are disposed to intersect each other, and the covers 40 are located below the howlings 20, there is a gap between the metal mask and a portion of the cover 40 that does not have contact with a howling 20, as shown in FIG. 1b. As a result, when the magnetic adsorption device adsorbs the metal mask plate, the portion of the cover 40 that does not have contact with the howling 20 is deformed toward the substrate due to an action of the magnetic adsorption device. At this time, the cover 40 will be in contact with the metal mask 30 and squeeze the metal mask 30, which causes a flatness of the metal mask 30 to decrease, thereby lowering the quality of the functional film layer formed on the substrate through the evaporation process and reducing the percent of pass of the display panel.

In order to explain a metal mask, a metal mask plate, and a method of manufacturing the same provided by some embodiments of the present disclosure, a detailed description is given below with reference to the accompanying drawings.

Figure 2A:
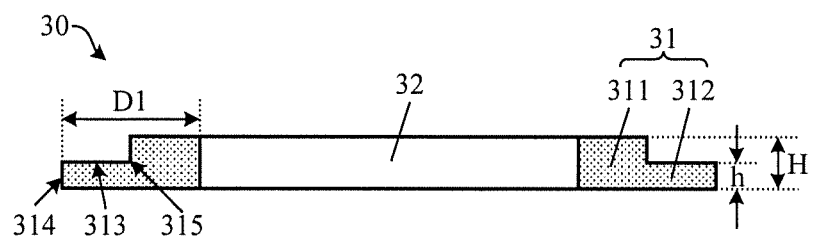
FIG. 2a is a schematic structural diagram of a metal mask according to some embodiments of the present disclosure.
Figure 2B:
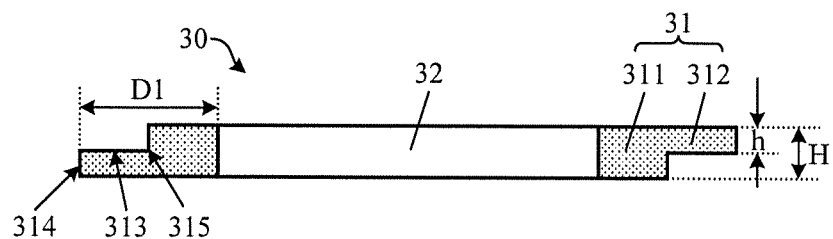
FIG. 2b is a schematic structural diagram of another metal mask according to some embodiments of the present disclosure.

Referring to FIG. 2a or 2b, some embodiments of the present disclosure provide a metal mask 30, and the metal mask 30 includes a mask body part 32 and two connecting parts 31 disposed at opposite sides of the mask body part 32. Each of the connecting parts 31 includes a body portion 311 and a single-stage step portion 312. A side of the body portion 311 is connected to the mask body part 32 and an opposite side of the body portion is connected to the single-stage step portion 312.

It will be understood that the side of the body portion 311 and the opposite side of the body portion are opposite surfaces of the body portion 311. In addition, in some embodiments, the mask body part 32 and the two connecting parts 31 may be integrally formed. In some other embodiments, the mask body part 32 and the two connecting parts 31 are formed independently, and then combined to each other.

Referring to FIG. 2a or 2b, the metal mask 30 includes two opposite connecting parts 31, and the two connecting parts 31 are respectively located at left and right sides of the mask body part 32. Each connecting part 31 has a shape of a single-stage step, and includes a body portion 311 and a single-stage step portion 312. The body portion 311 is connected to the mask body part 32 of the metal mask 30. In some embodiments, a thickness of the body portion 311 is the same as a thickness of the mask body part 32.

In each connecting part 31, the single-stage step portion 312 is connected to the body portion 311, and the single-stage step portion 312 is located at a side away from the mask body part 32 relative to the body portion 311 (for example, in the connecting part 31 on the left in FIG. 2a, the single-stage step portion 312 is located at a left side of the body portion 311; and in the connecting part 31 on the right, the single-stage step portion 312 is located at a right side of the body portion 311). In addition, the single-stage step portion 312 extends away from the mask body part 32. In some embodiments, a thickness of the single-stage step portion 312 is smaller than the thickness of the body portion 311.

Each single-stage step portion 312 has two surfaces that intersect with an axis extending along a thickness direction of the metal mask 30. In some embodiments, as shown in FIGS. 2a and 2b, both the two surfaces of the single-stage step portion 312 are perpendicular to the thickness direction of the metal mask 30. On this basis, one surface of the two surfaces is in a same plane as one of surfaces of the body portion 311 perpendicular to the thickness direction of the metal mask 30, and another surface of the two surfaces is not in a same plane as another one of the surfaces of the body portion 311 perpendicular to the thickness direction of the metal mask 30. The surface of the single-stage step portion 312 that is not in a same plane as the another one of the surfaces of the body portion 311 perpendicular to the thickness direction of the metal mask 30 is the step surface 313 of the single-stage step portion 312 (for example, in FIG. 2a, the step surface 313 in the connecting part 31 on the left is an upper surface of the single-stage step portion 312, and the step surface 313 in the connecting part 31 on the right is also an upper surface of the single-stage step portion 312).

Figure 2C:
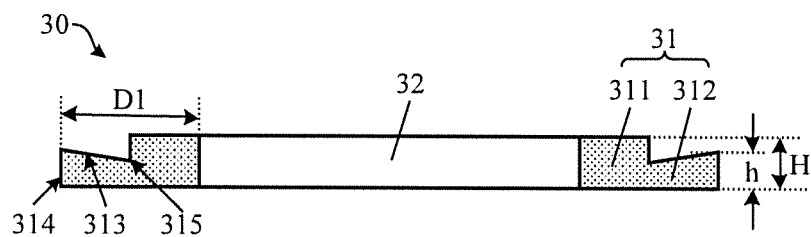
FIG. 2c is a schematic structural diagram of yet another metal mask according to some embodiments of the present disclosure.

In some other embodiments, as shown in FIG. 2c, in the two surfaces of the single-stage step portion 312 intersecting with the axis extending along a thickness direction of the metal mask 30, one surface is perpendicular to the thickness direction of the metal mask 30, and is in a same plane as one of surfaces of the body portion 311 perpendicular to the thickness direction of the metal mask 30; and another surface is an inclined surface, and an angle between the another surface and the axis extending along a thickness direction of the metal mask 30 is less than 90° and greater than 0°. Of course, the inclined surface shown in FIG. 2c is a schematic surface only, and the another surface may also be a surface with grooves or an uneven surface.

Apart from the step surface 313 and the surface that is in a same plane as the one of the surfaces of the body portion 311 perpendicular to the thickness direction of the metal mask 30, the single-stage step portion 312 further includes a rear end 315 close to and connected to the body portion 311 (for example, a right end of the single-stage step portion 312 in the connecting part 31 on the left in FIG. 2a) and a front end 314 away from the body portion 311 (for example, a left end of the single-stage step portion 312 in the connecting part 31 on the left in FIG. 2a).

Embodiments of the present disclosure are described blow by taking both the two surfaces of the single-stage step portion 312 being perpendicular to the thickness direction of the metal mask 30 as an example, and other embodiments may be obtained with reference to the following embodiments, which are not described herein.

Figure 6:
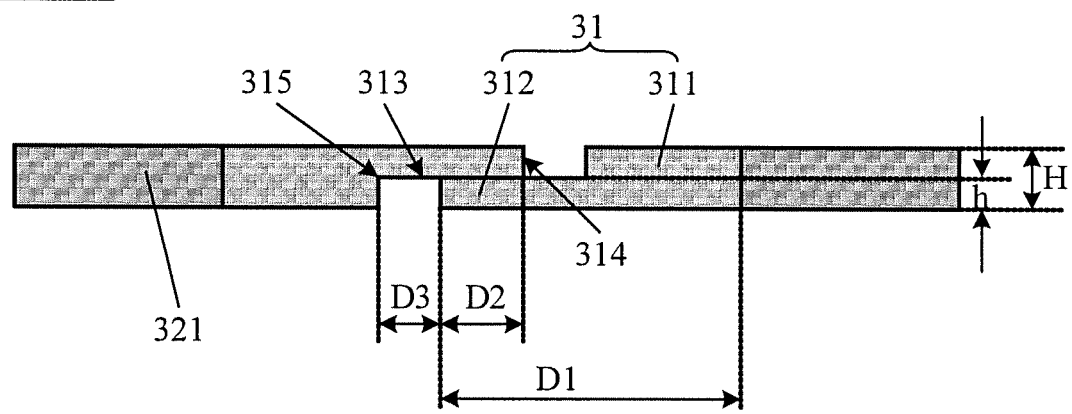
FIG. 6 is a cross-sectional view taken along line A-A of FIG. 4.
Figure 7:
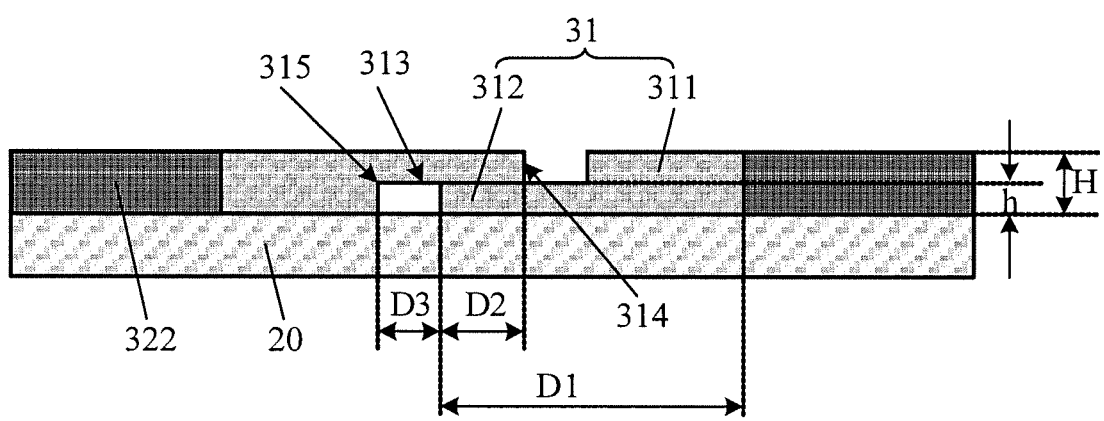
FIG. 7 is a cross-sectional view taken along line B-B of FIG. 4.

In some embodiments, a plurality of metal masks 30 described above are disposed on the frame to form a metal mask plate, and referring to FIGS. 6 and 7, any two adjacent metal masks 30 are directly connected by corresponding connecting parts 31. That is, for any one of the metal masks 30, a step surface 313 of a single-stage step portion 312 in a connecting part 31 of the metal mask 30 is overlaid on and connected to at least a part of a step surface 313 in a connecting part 31 of a metal mask 30 adjacent to the connecting part 31, so that there is no gap between the two adjacent metal masks 30. In this way, the hollow region 11 of the frame 10 may be entirely covered by the plurality of metal masks 30.

In a case where a metal mask plate including the plurality of metal mask 30 is overlaid on a substrate for an evaporation process, since the hollow region 11 of the frame 10 is entirely covered by the plurality of metal masks 30, there is no need to provide a cover to shield a gap between two adjacent metal masks 30. When the metal mask plate including the plurality of metal masks 30 is used in an evaporation process, the metal masks 30 will not be squeezed due to deformation of the covers, thereby improving the flatness of the metal masks 30. In this way, the quality of the formed functional film layer will not be affected, and the percent of pass of the display panel will be improved. For example, the problem of color mixing in the formed display panel will be avoided.

In addition, since there is no need to provide a cover to shield a gap between two adjacent metal masks 30 in the metal mask plate including the metal masks 30, an edge of a mask pattern region of the mask body part 32 in the metal mask 30 close to the connecting part 31 will not be affected by the cover. Therefore, when designing the metal mask 30, a width of the mask body part 32 may be increased, so as to increase design space for the mask body part 32 of the metal mask 30, and facilitate arrangement of the edge of the mask pattern region in the mask body part 32 of the metal mask 30.

Furthermore, in the related art, in a case where a cover is used for shielding a gap between two adjacent metal masks 30, grooves are usually provided in the frame 10, so that two ends of the cover may be respectively disposed in the grooves to connect the cover to the frame 10. In the metal mask plate including the metal masks 30 provided by the embodiments of the present disclosure, since covers are not required, there is no need to provide grooves in the frame 10 for mounting the covers, thereby reducing process cost of the metal mask plate and simplifying the manufacturing process of the metal mask plate.

Structures of the two connecting parts 31 of each metal mask 30 may be set according to actual needs. For example, referring to FIG. 2a, the step surfaces 313 of the two connecting parts 31 of the metal mask 30 are disposed facing a same direction in a thickness direction of the metal mask 30, that is, the step surfaces 313 of the two connecting parts 31 of the metal mask 30 are both upper surfaces of the single-stage step portions 312 in FIG. 2a. For another example, referring to FIG. 2b, the step surfaces 313 of the two connecting parts 31 of the metal mask 30 are disposed facing opposite directions in the thickness direction of the metal mask 30, that is, of the two connecting parts 31 of the metal mask 30 in FIG. 2b, the step surface 313 of one of the connecting parts 31 is an upper surface of the single-stage step portion 312, and the step surface 313 of another connecting part 31 is a lower surface of the single-stage step portion 312.

Referring to FIG. 2a or 2b, in the metal mask 30, the thickness of the body portion 311 of the connecting part 31 is the same as the thickness of the mask body part 32, and the thickness of the single-stage step portion 312 is smaller than the thickness of the body portion 311. In some embodiments, in the connecting part 31, the height h of the single-stage step portion 312 in the thickness direction of the metal mask 30 is one-third to two-thirds of the thickness H of the mask body part 32. In some examples, the height h of the single-stage step portion 312 in the thickness direction of the metal mask 30 is one-half of the thickness H of the mask body part 32.

In some embodiments, the thickness H of the mask body part 32 is 20 μm to 150 μm, and the height h of the single-stage step portion 312 of the connecting part 31 in the thickness direction of the metal mask 30 is 6.67 μm to 100 μm. In some other embodiments, the thickness H of the mask body part 32 is 20 μm to 150 μm, and the height h of the single-stage step portion 312 of the connecting part 31 in the thickness direction of the metal mask 30 is 10 μm to 75 μm.

In this way, the problem that a connection reliability and robustness of any two adjacent metal masks 30 may be reduced due to a thin thickness of the single-stage step portion 312 (e.g., smaller than 6.67 μm) may be avoided. Meanwhile, the problem that a thickness of a connected region of two adjacent metal masks 30 may be too thick and cause an adverse effect on the evaporation process due to a thick thickness of the single-stage step portion 312 (for example, larger than 100 μm) may also be avoided.

As for the connecting part 31, parameters of the connecting part 31 may be set according to actual needs. In some embodiments, as shown in FIG. 2a or 2b, in an extending direction of the single-stage step portion 312, a width D1 of the connecting part 31 is 0.5 mm to 3 mm. That is, in a left-right direction in FIG. 2a or 2b, the width D1 of the connecting part 31 is 0.5 mm to 3 mm.

Figure 3:
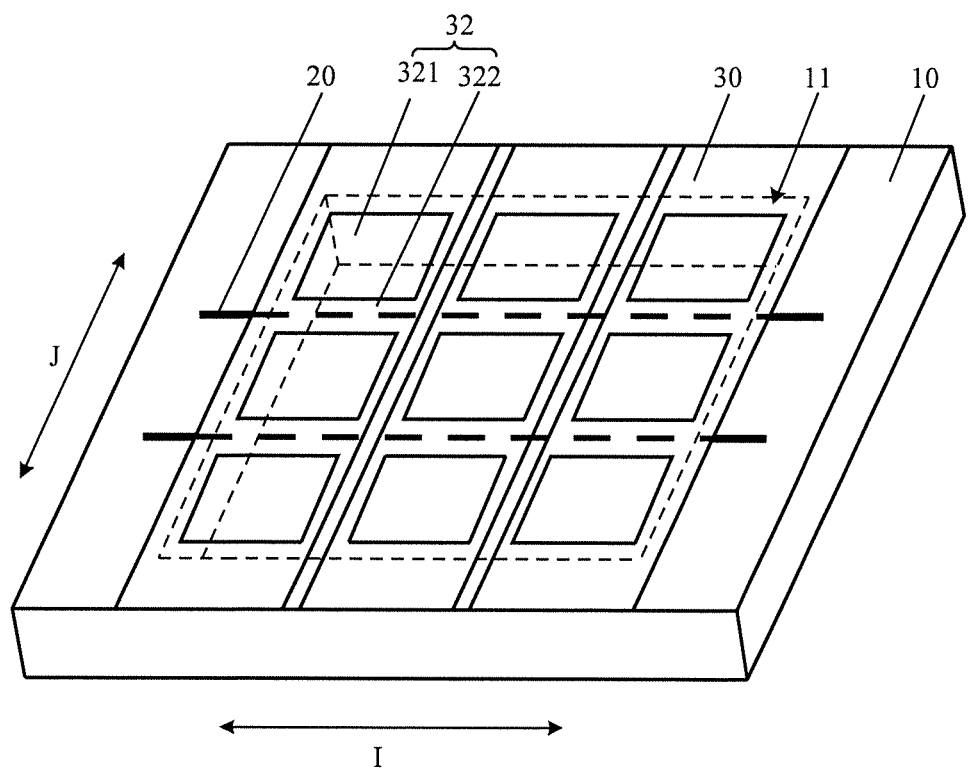
FIG. 3 is a schematic structural diagram of a metal mask plate according to some embodiments of the present disclosure.
Figure 4:
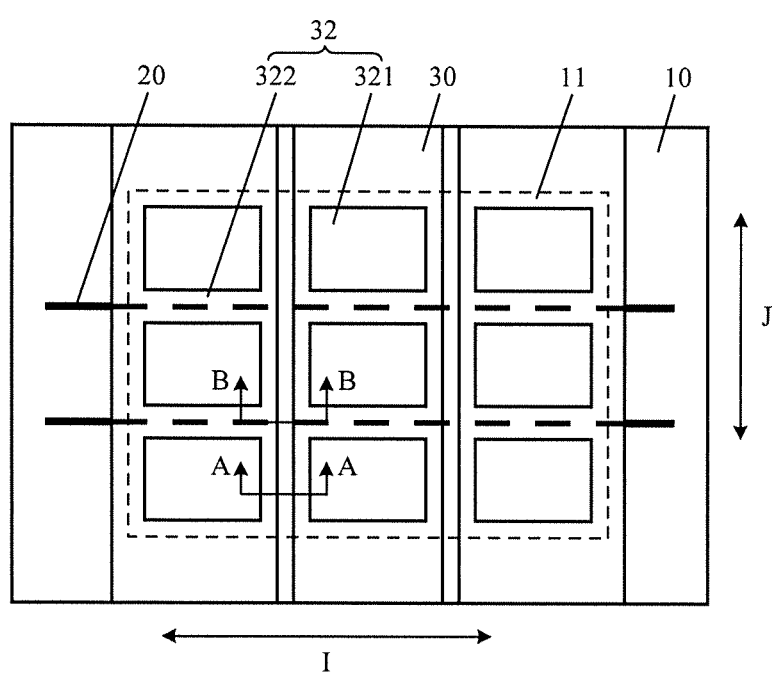
FIG. 4 is a plan view of FIG. 3.
Figure 5:
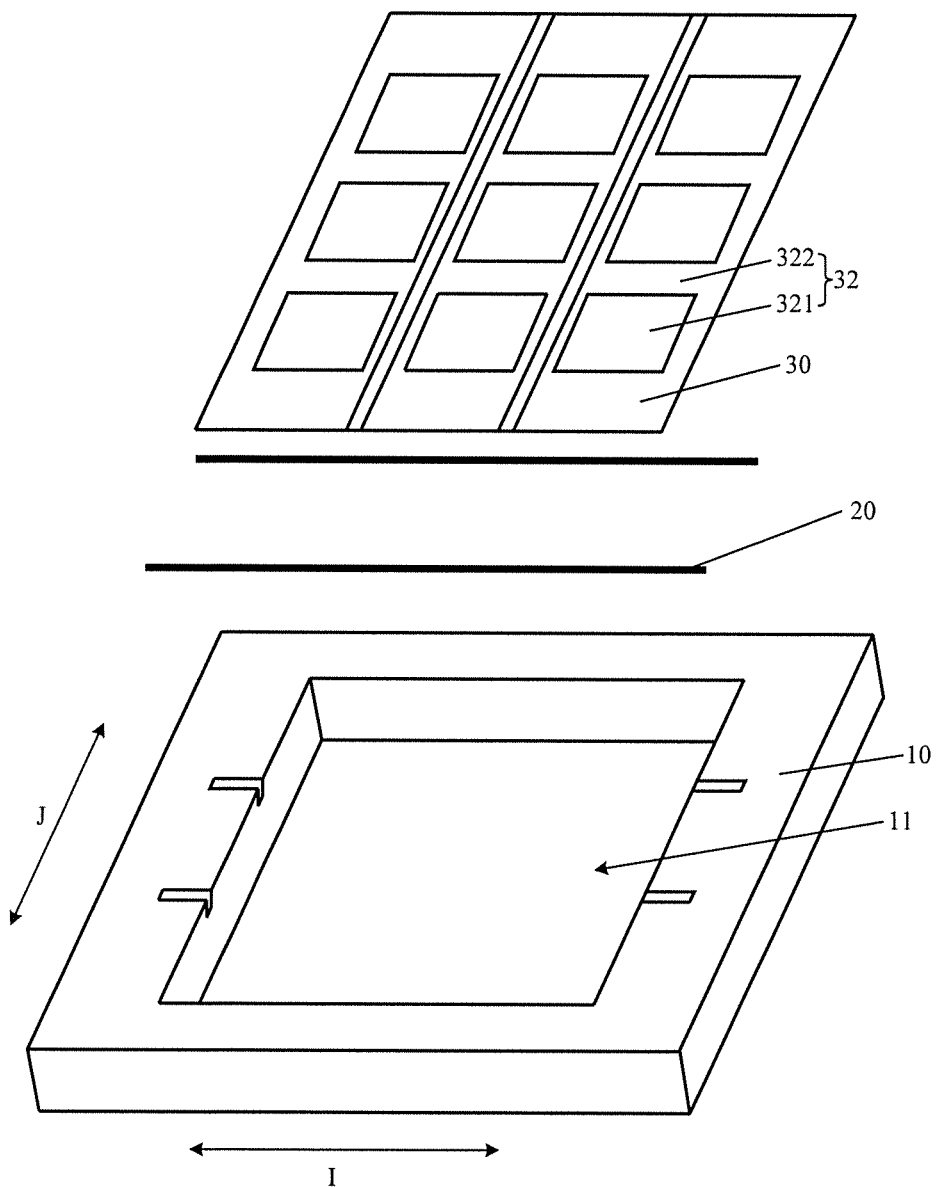
FIG. 5 is a schematic exploded diagram of a metal mask plate according to some embodiments of the present disclosure.

Referring to FIGS. 3-5, some embodiments of the present disclosure provide a metal mask plate, which includes a frame 10 and a plurality of metal masks 30. A middle region of the frame 10 is a hollow region 11, and each metal mask 30 spans across the hollow region 11 of the frame 10 in a first direction J, and two ends of each metal mask 30 along the first direction J are connected to the frame 10. The plurality of metal masks 30 are sequentially arranged in a second direction I, and any two adjacent metal masks 30 are directly connected, so that there is no gap between any two adjacent metal masks 30. The first direction J and the second direction I intersect each other.

The metal mask plate may be used in an evaporation device to fabricate functional film layers of a display panel through an evaporation process, for example, to fabricate organic light-emitting layers of OLED devices in an OLED display panel.

Referring to FIG. 5, the frame 10 is, for example, a rectangular frame, and a rectangular hollow region 11 is provided in the middle of the rectangular frame. The plan view of the frame 10 is a hollow rectangle. It will be noted that, in practical use, a shape of the frame 10 and a shape of the hollow region 11 in the middle of the frame 10 may be determined according to a shape of a structure to be deposited on the substrate, which is not limited herein. Generally, the frame 10 is a closed loop structure.

In some embodiments, referring to FIG. 4, it is assumed that a top-bottom direction is the first direction J, and a left-right direction is the second direction I, and the first direction J and the second direction I intersect each other. It will be noted that, the first direction J and the second direction I are determined in this way in the embodiments of the present disclosure only to facilitate description of a structure of the metal mask plate, and it does not mean that the metal mask plate of this structure can only be arranged in the way as shown in FIG. 4 along the first direction J and the second direction I.

Of the plurality of metal masks 30, each metal mask 30 spans across the hollow region 11 of the frame 10 in the first direction J, and two ends of each metal mask along the first direction J are respectively connected to the frame 10. That is, as shown in FIG. 4, each metal mask 30 spans across the hollow region 11 of the frame 10 in the top-bottom direction, and upper and lower ends of each metal mask 30 are connected to the frame 10. In some embodiments, upper and lower ends of each metal mask 30 in FIG. 4 are connected to the frame 10 by soldering. Referring to FIGS. 4, 6 and 7, the plurality of metal masks 30 are sequentially arranged in the second direction I. That is, as shown in FIG. 4, the plurality of metal masks 30 are sequentially arranged in the left-right direction, and any two adjacent metal masks are directly connected, so that there is no gap between any two adjacent metal masks 30.

Based on this, due to the fact that each metal mask 30 spans across the hollow region 11 of the frame 10 in the first direction J, two ends of each metal mask 30 along the first direction J are connected to the frame 10, the plurality of metal masks 30 are sequentially arranged in the second direction I, and any two adjacent metal masks 30 are directly connected so that there is no gap between any two adjacent metal masks 30, the hollow region 11 of the frame 10 is entirely covered by the plurality of metal masks 30.

In a case where a metal mask plate provided by the embodiments of the present disclosure is used in an evaporation device to form a functional film layer on a substrate, the metal mask plate is overlaid on a side of the substrate on which an evaporation material will be deposited, and the metal mask 30 is close to the substrate relative to the frame 10. Then, the overlapped substrate and metal mask plate are placed between a magnetic adsorption device and an evaporation source in the evaporator device, with the overlapped substrate and metal mask plate located above the evaporation source, and the metal mask plate located below the substrate. Then, the metal mask plate is adsorbed by the magnetic adsorption device above the substrate in the evaporation device, so as to attach the metal mask plate to the substrate. At this time, the frame 10 and the plurality of metal masks 30 are both attached to the substrate, and the plurality of metal masks 30 fully cover the hollow region 11 of the frame 10, so that the plurality of metal masks 30 fully cover a portion of the substrate corresponding to the hollow region 11 of the frame 10. Then, the evaporation material in the evaporation source is heated to form vapor, which will reach the substrate, and be deposited on the substrate to form a functional film layer.

As can be seen from the above, in the metal mask plate provided by the embodiments of the present disclosure, due to the fact that each of the plurality of metal masks 30 spans across the hollow region 11 of the frame 10 in the first direction J, the plurality of metal masks 30 are sequentially arranged in the second direction I, and any two adjacent metal masks 30 are directly connected so that there is no gap between any two adjacent metal masks 30, the hollow region 11 of the frame 10 is entirely covered by the plurality of metal masks 30. When the metal mask plate provided by the embodiments of the present disclosure is overlaid on the substrate, the plurality of metal masks 30 fully cover a portion of the substrate corresponding to the hollow region 11 of the frame 10, therefore there is no need to provide covers to shield a gap between any two adjacent metal masks 30 in the metal mask plate provided by the embodiments of the present disclosure. When the metal mask plate provided by the embodiments of the present disclosure is used in an evaporation process, the metal mask 30 will not be squeezed due to deformation of the covers, thereby improving the flatness of the metal mask 30. In this way, the quality of the formed functional film layer will not be affected, and the percent of pass of the display panel will be improved. For example, the problem of color mixing in the formed display panel will be avoided.

In addition, since there is no gap between any two adjacent metal masks 30 in the metal mask plate provided by the embodiments of the present disclosure, there is no need to provide covers to shield a gap between any two adjacent metal masks 30 in the metal mask plate provided by the embodiments of the present disclosure. Based on this, when arranging display panel regions on the substrate (i.e., the substrate is a mother board, which includes a plurality of display panel regions, and each display panel region is used in a display panel after being cut from the substrate), a gap between any two adjacent display panel regions may be reduced, thereby increasing a number of display panel regions on the substrate, and in turn improving a utilization efficiency of the substrate. Meanwhile, since a gap between any two adjacent display panel regions may be reduced, when a same number of display panel regions are arranged on the substrate, an area of a mask pattern region on the metal mask 30 may be increased, thereby facilitating arrangement of an edge of the mask pattern region. In addition, an omission of covers eliminates the adverse effect of the covers on the flatness of the metal mask 30, thereby reducing interference factors that affect a resolution and pixel accuracy of the display panel.

Moreover, in the metal mask plate provided by the embodiments of the present disclosure, there is no need to provide a cover to shield a gap between any two adjacent metal masks 30. Therefore, the metal mask plate provided by the embodiments of the present disclosure does not include covers, which has reduced material cost of the metal mask plate. Meanwhile, in the related art, when using a cover to shield a gap between any two adjacent metal masks 30, grooves are usually provided in the frame 10, so that two ends of the cover can be respectively disposed in the grooves to connect the cover to the frame 10. In the metal mask plate provided by the embodiments of the present disclosure, however, since the covers are not required, there is no need to provide grooves in the frame 10 for mounting the covers, thereby reducing the process cost of the metal mask plate and simplifying the manufacturing process of the metal mask plate.

In some embodiments, any two adjacent metal masks 30 are directly connected, so that there is no gap between any two adjacent metal masks 30. In practical use, direct connection between two adjacent metal masks 30 may be achieved in a plurality of ways. Two methods are described below as examples, but the methods actually include but are not limited to the following two methods.

In a first method, referring to FIGS. 2a, 2b and 8-11, in the metal mask plate, the metal masks 30 as described in the above embodiments may be adopted. That is, each metal mask 30 may adopt a structure as shown in FIG. 2a or 2b: the metal mask 30 includes two opposite connecting parts 31 that are located at two sides of the metal mask 30 in the second direction I. Each of the connecting parts 31 includes a body portion 311 and a single-stage step portion 312, a side of the body portion 311 is connected to the mask body part 32 of the metal mask 30 and an opposite side of the body portion 311 is connected to the single-stage step portion 312. The single-stage step portion 312 includes a step surface 313, for example, perpendicular to the thickness direction of the metal mask 30, and step surfaces 313 of two adjacent connecting parts 31 of any two adjacent metal masks 30 are partially overlapped and connected to each other.

Referring to FIG. 2a or 2b, the metal mask 30 includes two opposite connecting parts 31, and the two connecting parts are located at two sides of the mask body part 32 in the second direction I. That is, the two connecting parts 31 are respectively located at left and right sides of the metal mask 30 in FIG. 2a or 2b. Each connecting part 31 includes a body portion 311 and a single-stage step portion 312. The body portion 311 is connected to the mask body part 32 of the metal mask 30, and the thickness of the body portion 311 is the same as the thickness of the mask body part 32. The single-stage step portion 312 is away from the mask body part 32 relative to the body portion 311 (for example, in FIG. 2, in the connecting part 31 on the left, the single-stage step portion 312 is located at the left side of the body portion 311; and in the connecting part 31 on the right, the single-stage step portion 312 is located at the right side of the body portion 311). The single-stage step portion 312 is connected to the body portion 311, and extends away from the mask body part 32. The thickness of the single-stage step portion 312 is smaller than the thickness of the body portion 311. In addition, apart from the step surface 313, the single-stage step portion 312 further includes a rear end 315 close to and connected to the body portion 311 (for example, the right end of the single-stage step portion 312 in the connecting part 31 on the left in FIG. 2a) and a front end 314 away from the body portion 311 (for example, the left end of the single-stage step portion 312 in the connecting part on the left 31 in FIG. 2a).

Referring to FIG. 8, 9, 10 or 11, in a case where any two adjacent metal masks 30 are directly connected, a step surface 313 of a connecting part 31 of a metal mask 30 and a step surface 313 of a connecting part 31 of a metal mask 30 adjacent to the connecting part 31 are partially overlapped and connected to each other. For example, in FIG. 8, when the metal mask 30 on the left is directly connected to the metal mask 30 in the middle, the step surface 313 of the connecting part 31, located at a right side, of the metal mask 30 on the left and the step surface 313 of the connecting part 31, located at a left side, of the metal mask 30 in the middle are partially overlapped and connected to each other, so that there is no gap between the two metal masks 30.

In a case where the connecting part 31 includes the single-stage step portions 312, any two adjacent metal masks 30 may be directly connected. In the two metal masks 30, the step surface 313 of the connecting part 31 of one metal mask 30 and the step surface 313 of the connecting part 31 of another metal mask are partially overlapped and connected to each other, so that there is no gap between the two metal masks 30. With this design, the connection strength and reliability of the two adjacent metal masks 30 may be improved.

In the first method, structures of the two connecting parts 31 of each metal mask 30 may be set according to actual needs. For example, referring to FIG. 2a, the step surfaces 313 of the two connecting parts 31 of the metal mask 30 are disposed facing a same direction in the thickness direction of the metal mask 30. That is, the step surfaces 313 of the two connecting parts 31 of the metal mask 30 in FIG. 2a are upper surfaces of the single-stage step portions 312 respectively. For another example, referring to FIG. 2b, the step surfaces 313 of the two connecting parts 31 of the metal mask 30 are disposed facing opposite directions in the thickness direction of the metal mask 30. That is, of the two connecting parts 31 of the metal mask 30 in FIG. 2b, the step surface 313 of one connecting part 31 is an upper surface of the single-stage step portion 312, and the step surface 313 of another connecting part 31 is a lower surface of the single-stage step portion 312.

Figure 10:
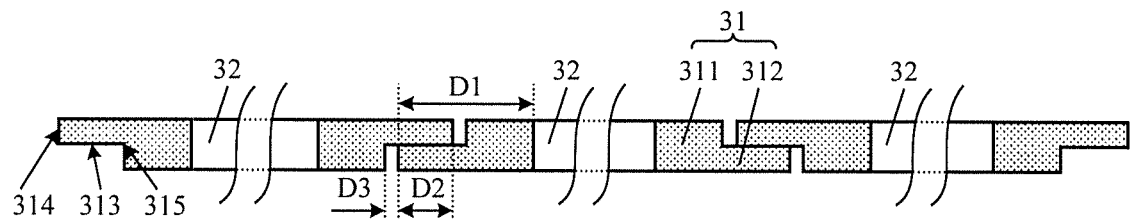
FIG. 10 is a schematic diagram showing yet another connection structure of a plurality of metal masks according to some embodiments of the present disclosure.

In some embodiments, it is arranged that all of the metal masks 30 in the metal mask plate have the structure as shown in FIG. 2a. That is, the step surfaces 313 of the two connecting parts 31 of each metal mask 30 are disposed facing a same direction in the thickness direction of the metal mask 30. In this case, the plurality of metal masks 30 may be connected by a structure as shown in FIG. 10.

Figure 11:
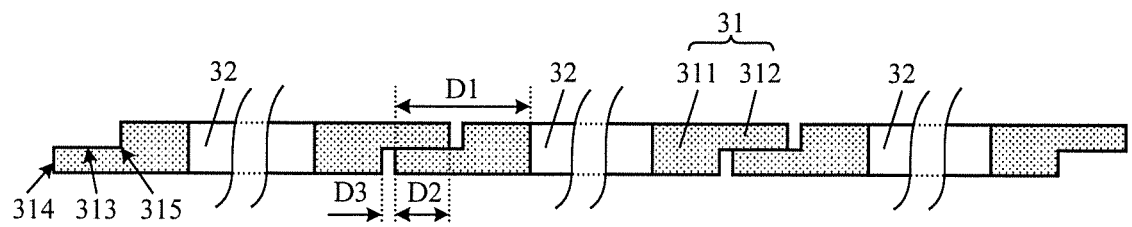
FIG. 11 is a schematic diagram showing yet another connection structure of a plurality of metal masks according to some embodiments of the present disclosure.

In some other embodiments, it is arranged that all of the metal masks 30 in the metal mask plate have the structure as shown in FIG. 2b. That is, the step surfaces 313 of the two connecting parts 31 of each metal mask 30 are disposed facing opposite directions in the thickness direction of the metal mask 30. In this case, the plurality of metal masks 30 may be connected by a structure as shown in FIG. 11.

In yet some other embodiments, of the plurality of metal masks 30 in the metal mask plate, it is arranged that each of a part of the metal masks 30 has the structure as shown in FIG. 2a, and each of remaining metal masks 30 has the structure as shown in FIG. 2b. That is, of the plurality of metal masks 30, the step surfaces 313 of the two connecting parts 31 of each of a part of the metal masks 30 are disposed facing a same direction in the thickness direction of the metal mask 30, and the step surfaces 313 of the two connection portions 31 of each of the remaining metal masks 30 are disposed facing opposite directions in the thickness direction of the metal mask 30. In this case, the connection method of the plurality of metal masks 30 may be set according to actual conditions. For example, in a case where a number of metal masks 30 is an even number, it is arranged that half of the number of metal masks 30 have the structure as shown in FIG. 2a, and remaining half of the number of metal masks 30 have the structure as shown in FIG. 2b. In this case, the metal masks 30 having the structure as shown in FIG. 2a and the metal masks 30 having the structure as shown in FIG. 2b may be alternatively arranged and connected together.

Figure 8:
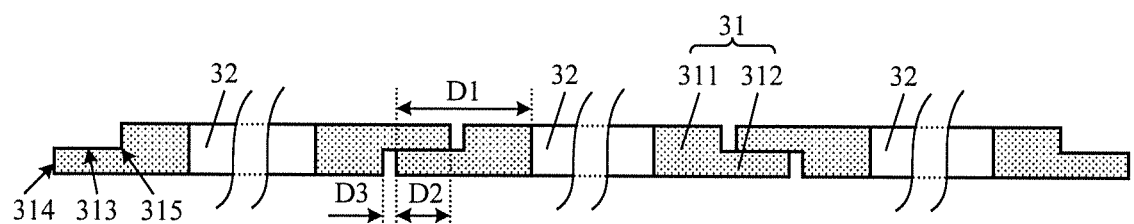
FIG. 8 is a schematic diagram showing a connection structure of a plurality of metal masks according to some embodiments of the present disclosure.
Figure 9:
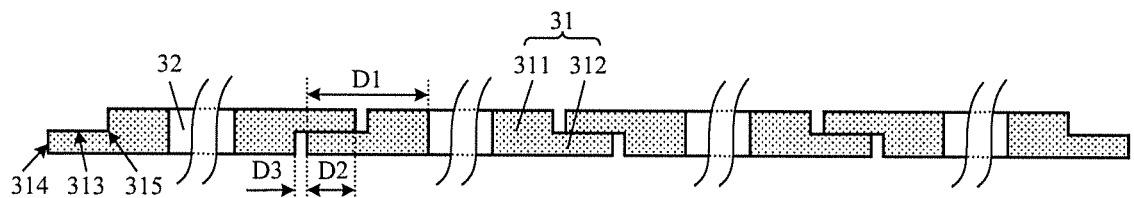
FIG. 9 is a schematic diagram showing another connection structure of a plurality of metal masks according to some embodiments of the present disclosure.

In a case where a part of the plurality of metal masks 30 have the structure as shown in FIG. 2a, and the remaining metal masks 30 have the structure as shown in FIG. 2b, in some embodiments, referring to FIG. 8 or 9, of the plurality of metal masks 30, it is arranged that a single metal mask 30 has the structure as shown in FIG. 2a, and the remaining metal masks 30 all have the structure as shown in FIG. 2b. In this case, when the plurality of metal masks 30 are sequentially arranged in the second direction I, the metal mask 30 in the middle of the plurality of metal mask 30 has the structure as shown in FIG. 2a. That is, in the second direction I, of the plurality of metal masks 30, the step surfaces 313 of the two connecting parts 31 of a single metal mask 30 located in the middle of the hollow region 11 are disposed facing a same direction in the thickness direction of the metal mask 30, and the step surfaces 313 of the two connecting parts 31 of each of the remaining metal masks 30 are disposed facing opposite directions in the thickness direction of the metal mask 30. Furthermore, in the second direction I, from the middle to both sides of the hollow region 11, of any two adjacent metal masks 30, a step surface 313 of a connecting part 31 of a metal mask 30 close to a side of the hollow region 11 is disposed on a step surface 313 of a connecting part 31 of a metal mask 30 close to the middle of the hollow region 11.

In some embodiments, in a case where the number of the plurality of metal masks 30 is an odd number, for example n (n is an odd number) and the plurality of metal masks 30 are sequentially arranged in the second direction I, the metal mask 30 in the middle (i.e., the (n+1)/2-th metal mask 30) has the structure as shown in FIG. 2a, and corresponds to the middle of the hollow region 11. In the second direction I, from the metal mask 30 in the middle to the metal masks 30 on both sides, of any two adjacent metal masks 30, a step surface 313 of the connecting part 31 of a metal mask 30 close to a side of the hollow region 11 is disposed on a step surface 313 of a connecting part 31 of a metal mask 30 close to the middle of the hollow region 11.

For example, referring to FIG. 8, assuming that the number of the metal masks 30 is three, the three metal masks 30 are sequentially arranged in the second direction I. The metal mask 30 in the middle (i.e., the second metal mask 30) has the structure as shown in FIG. 2a, and corresponds to the middle of the hollow region 11, and each metal mask 30 on both sides has the structure as shown in FIG. 2b. When the three metal masks 30 are disposed on the frame 10, the metal mask 30 corresponding to the middle of the hollow region 11 is first placed across the middle of the hollow region 11 in the first direction J, and two ends of the metal mask 30 along the first direction J are respectively connected to the frame 10. The metal mask 30 has the structure as shown in FIG. 2a, and the step surfaces 313 of the connecting parts 31 of the metal mask 30 are upper surfaces of the single-stage step portions 312.

Then, the metal mask 30 on the left is placed across a left portion of the hollow region 11 in the first direction J, and the metal mask 30 on the left has the structure as shown in FIG. 2b. The step surface 313 of the right connecting part 31 of the metal mask 30 on the left faces downward, and is placed on and connected to the step surface 313 of the left connecting part 31 of the metal mask 30 in the middle; and the step surface 313 of the right connecting part 31 of the metal mask 30 on the left partially overlaps with the step surface 313 of the left connecting part 31 of the metal mask 30 in the middle. Two ends of the metal mask 30 on the left along the first direction J are connected to the frame 10, and the step surface 313 of the right connecting part 31 of the metal mask 30 on the left is connected to the step surface 313 of the left connecting part 31 of the metal mask 31 in the middle.

On this basis, the metal mask 30 on the right is placed across a right portion of the hollow region 11 in the first direction J, and the metal mask 30 on the right has the structure as shown in FIG. 2b. The step surface 313 of the left connecting part 31 of the metal mask 30 on the right faces downward, and is placed on and connected to the step surface 313 of the right connecting part 31 of the metal mask 30 in the middle; and the step surface 313 of the left connecting part 31 of the metal mask 30 on the right partially overlaps with the step surface 313 of the right connecting part of the metal mask in the middle. Two ends of the metal mask 30 on the right along the first direction J are connected to the frame 10, and the step surface 313 of the left connecting part 31 of the metal mask 30 on the right is connected to the step surface 313 of the right connecting part 31 of the metal mask 31 in the middle.

It will be noted that, this embodiment is illustrated by taking an example in which after the metal mask 30 in the middle is arranged in the middle of the hollow region 11, the metal mask 30 on the left is connected to the frame 10 before the metal mask 30 on the right is connected to the frame 10. However, in practical use, after the metal mask 30 in the middle is arranged in the middle of the hollow region 11, the metal mask 30 on the right may be connected to the frame 10 before the metal mask 30 on the left is connected to the frame 10.

In some embodiments, in the case where the number of the plurality of metal masks 30 is an even number, for example, m (m is an even number), the plurality of metal masks 30 are sequentially arranged in the second direction I, and one of two metal masks 30 in the middle (i.e., the m/2-th and (m+1)/2-th mental masks 30) has the structure as shown in FIG. 2a. In the second direction I, from this metal mask 30 to the metal masks 30 on both sides, of any two adjacent metal masks 30, a step surface 313 of a connecting part 31 of a metal mask 30 close to a side of the hollow region 11 is disposed on a step surface 313 of a connecting part 31 of a metal mask 30 close to the middle of the hollow region 11.

For example, referring to FIG. 9, assuming that the plurality of metal masks 30 include four metal masks, the four metal masks 30 are sequentially arranged in the second direction I. A metal mask 30 on the left in two metal masks 30 in the middle has the structure as shown in FIG. 2a, and remaining metal masks 30 all have the structure as shown in FIG. 2b. That is, assuming that the plurality of metal masks 30 include four metal masks 30, and the left-right direction is the second direction I, from left to right, the second metal mask 30 has the structure as shown in FIG. 2a, and the remaining metal masks have the structure as shown in FIG. 2b. When arranging the four metal masks 30 on the frame 10, the metal mask 30 having the structure as shown in FIG. 2a is placed across a left side of the middle of the hollow region 11 in the first direction J, and two ends of the metal mask 30 along the first direction J are connected to the frame 10, wherein the step surfaces 313 of the connection portions 31 of the metal mask 30 are upper surfaces of the single-stage step portions 312.

Then, a leftmost metal mask 30 (the first metal mask 30) in FIG. 9 spans across the left portion of the hollow region 11 in the first direction J, wherein the leftmost metal mask 30 in FIG. 9 has the structure as shown in FIG. 2b. The step surface 313 of the right connecting part 31 of the leftmost metal mask 30 faces downward, and is placed on and connected to the step surface 313 of the left connecting part 31 of the metal mask 30 on the left in the two metal masks 30 in the middle (the second metal mask 30) in FIG. 9; and the step surface 313 of the right connecting part 31 of the leftmost metal mask 30 partially overlaps with the step surface 313 of the left connecting part 31 of the second metal mask 30. Two ends of the leftmost metal mask 30 along the first direction in FIG. 9 are connected to the frame 10, and the step surface 313 of the right connecting part 31 of the leftmost metal mask 30 in FIG. 9 is connected to the step surface 313 of the left connecting part 31 of the second metal mask 30 in FIG. 9.

Thereafter, the metal mask 30 on the right (the third metal mask 30) in the two metal masks in the middle in FIG. 9 is placed across a right side of the middle of the hollow region 11 in the first direction J, wherein the third metal mask 30 in FIG. 9 has the structure as shown in FIG. 2b. The step surface 313 of the left connecting part 31 of the third metal mask 30 in FIG. 9 faces downward, and is placed on and connected to the step surface 313 of the right connecting part 31 of the second metal mask 30 in FIG. 9; and the step surface 313 of the left connecting part 31 of the third metal mask 30 partially overlaps with the step surface 313 of the right connecting part 31 of the second metal mask 30 in FIG. 9. Two ends of the third metal mask 30 along the first direction J in FIG. 9 are connected to the frame 10, and the step surface 313 of the left connecting part 31 of the third metal mask 30 in FIG. 9 is connected to the step surface 313 of the right connecting part 31 of the second metal mask 30 in FIG. 9.

On this basis, a rightmost metal mask 30 (the fourth metal mask 30) in FIG. 9 is placed across a right portion of the hollow region 11 in the first direction J, wherein the rightmost metal mask 30 in FIG. 9 has the structure as shown in FIG. 2b. The step surface 313 of the left connecting part 31 of the rightmost metal mask 30 faces downward, and is placed on and connected to the step surface 313 of the right connecting part 31 of the third metal mask 30 in FIG. 9; and the step surface 313 of the left connecting part 31 of the rightmost metal mask 30 partially overlaps with the step surface 313 of the right connecting part of the third metal mask 30 in FIG. 9. Two ends of the rightmost metal mask 30 along the first direction J in FIG. 9 are connected to the frame 10, and the step surface 313 of the left connecting part 31 of the rightmost metal mask 30 in FIG. 9 is connected to the step surface 313 of the right connecting part 31 of the third metal mask 30 in FIG. 9.

It will be noted that, this embodiment is illustrated by taking an example in which after the metal mask 30 on the left in the two metal masks in the middle in FIG. 9 is arranged across the left side of the middle of the hollow region 11, the metal mask 30 on the left side of the metal mask 30 is arranged on the frame 10 before the metal masks 30 on the right side of the metal mask 30 are sequentially arranged on the frame 10. However, in practical use, after the metal mask 30 on the left in the two metal masks in the middle in FIG. 9 is arranged across the left side of the middle of the hollow region 11, the metal masks 30 at the right side of the metal mask 30 may be arranged on the frame 10 before the metal mask 30 at the left side of the metal mask 30 is arranged on the frame 10. In addition, this embodiment is described herein by taking an example in which the metal mask 30 on the left in the two metal masks 30 in the middle in FIG. 9 has the structure as shown in FIG. 2a. However, in some other embodiments, it is arranged that the metal mask 30 on the right in the two metal masks 30 in the middle in FIG. 9 has the structure as shown in FIG. 2a.

Of the plurality of metal masks 30 of the metal mask plate, the step surfaces 313 of the two connecting parts 31 of a single metal mask 30 located in the middle of the hollow region 11 are disposed facing the same direction in the thickness direction of the metal mask 30, and the step surfaces 313 of the two connecting parts 31 of each of the remaining metal masks 30 are disposed facing opposite directions in the thickness direction of the metal mask 30; moreover, in the second direction I, from the middle to both sides of the hollow region 11, of any two adjacent metal masks 30, a step surface 313 of a connecting part 31 of a metal mask 30 close to a side of the hollow region 11 is disposed on a step surface 313 of a connecting part 31 of a metal mask 30 close to the middle of the hollow region 11. This design facilitates assembly of the plurality of metal masks 30.

In the first method, in some embodiments, the width D1 of the connecting part 31 in the second direction I is 0.5 mm to 3 mm.

On this basis, referring to FIGS. 6-11, in some embodiments, a width of an overlapping area D2 between a step surface 313 of a connecting part 31 of any one of the metal masks 30 and a step surface 313 of a connecting part 31 of a metal mask 30 adjacent to the connecting part 31 is 20% to 80% of the width D1 of the connecting part 31. That is, in the case where any two adjacent metal masks 30 are directly connected by the connecting parts 31, the step surfaces 313 of the two connecting parts 31 partially overlap, and the width of the overlapping area D2 is 20% to 80% of the width D1 of the connecting part 31. That is, the width of the overlapping area D2 is 0.1 mm to 2.4 mm.

Referring to FIGS. 6-11, the single-stage step portion 312 of the connecting part 31 includes a rear end 315 close to and connected to the body portion 311 and a front end 314 away from the body portion 311, and there is a distance D3 between the front end 314 of any one of the connecting parts 31 and the rear end 315 of a connecting part 31 of a metal mask 30 adjacent to the connecting part 31. In some embodiments, the distance D3 is 2% to 20% of the width of the connecting part 31, that is, the distance D3 between the front end 314 of any one of the connecting parts 31 and the rear end 315 of a connecting part 31 of a metal mask 30 adjacent to the connecting part 31 is 0.01 mm to 0.6 mm. In the case where the metal mask plate provided by the embodiments of the present disclosure is used in an evaporation device to form a functional film layer on the substrate through the evaporation process, and the metal mask plate is adsorbed by the magnetic adsorption device, this design may leave a deformation space for the metal mask 30 when the metal mask 30 is adsorbed by the magnetic adsorption device, and thus improve the flatness of the metal mask 30.

It will be noted that the width D1, the width of the overlapping area D2, and the distance D3 described above can be set according to actual needs. For example, depending on the product, the width D1 is set to 0.5 mm to 3 mm; the width of the overlapping area D2 is set to 0.1 mm to 2.4 mm, and the distance D3 is set to 0.01 mm to 0.6 mm. On this basis, the distance D3 is optionally set to 0.01 mm to 0.1 mm.

In the first method, referring to FIG. 2a or 2b, in some embodiments, in the connecting part 31, the height h of the single-stage step portion 312 in the thickness direction of the metal mask 30 is one-third to two-thirds of the thickness H of the mask body part 32. In some examples, the height h of the single-stage step portion 312 in the thickness direction of the metal mask 30 is one-half of the thickness H of the mask body part 32. For example, the thickness H of the mask body part 32 is 20 µm to 150 µm, and the height h of the single-stage step portion 312 in the connection portion 31 in the thickness direction of the metal mask 30 is 6.67 µm to 100 µm. On this basis, the height h of the single-stage step portion 312 in the thickness direction of the metal mask 30 is optionally 10 µm to 75 µm. In this way, it may be avoided that the connection reliability and robustness of any two adjacent metal masks 30 are lowered due to the single-stage step portion 312 being too thin (e.g., less than 6.67 µm), and it may be avoided that the connection region is too thick when the two adjacent metal masks 30 are directly connected due to the single-stage step portion 312 being too thick (for example, larger than 100 µm), thereby preventing adverse impact on the evaporation process.

Any two adjacent metal masks 30 are directly connected, so that there is no gap between the two adjacent metal masks 30. In practical use, the following method may also be adopted.

Figure 12:
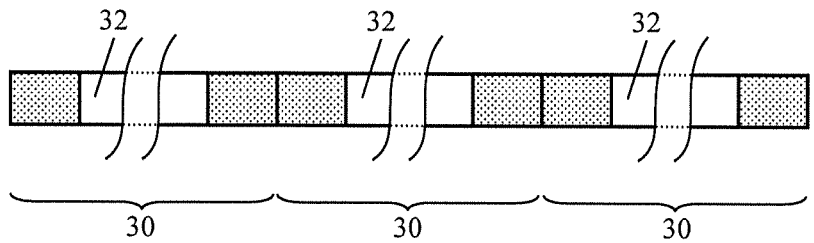
FIG. 12 is a schematic diagram showing yet another connection structure of a plurality of metal masks according to some embodiments of the present disclosure.

In a second method, referring to FIG. 12, in the second direction I, a side surface of any one of the metal masks 30 is opposite to a side surface of a metal mask 30 adjacent to the side surface, and the side surface of the any one of the metal masks 30 is attached to and connected to the side surface of the metal mask 30 adjacent to the metal mask 30. That is, when any two adjacent metal masks 30 are directly connected, the direct connection of the two metal masks 30 is achieved by connecting two opposite side surfaces of the two metal masks 30, so that there is no gap between the two metal masks 30.

The direct connection of any two adjacent metal masks 30 may be achieved in other ways, which can be set according to actual needs.

In some embodiments, referring to FIGS. 3-5, the metal mask 30 includes a mask body part 32, and the mask body part 32 includes at least one mask pattern region 321 corresponding to the display panel region on the substrate, and the number of the at least one mask pattern region 321 of each metal mask 30 may be set according to actual needs. For example, the at least one mask pattern region 321 of each metal mask 30 includes a single mask pattern region 321. Alternatively, the at least one mask pattern region 321 of each metal mask 30 includes a plurality of (at least two) mask pattern regions 321. In this case, the plurality of mask pattern regions 321 may be arranged by a plurality of ways. For example, the plurality of mask pattern regions 321 are arranged in an array.

In some embodiments, the plurality of mask pattern regions 321 of each metal mask 30 are arranged in order in the first direction J, and the mask body part 32 further includes at least one invalid mask region 322 each of which is provided between two adjacent mask pattern regions 321 of the plurality of mask pattern regions 321.

In a case where the metal mask 30 includes a plurality of mask pattern regions 321 arranged in order in the first direction J, in order to prevent the metal mask 30 from collapsing due to the length of the metal mask 30 in the first direction J being too long, with continued reference to FIGS. 3-5 and 7, in some embodiments, the metal mask plate further includes at least one howling 20 for supporting the metal masks 30. Each howling 20 spans across the hollow region 11 of the frame 10 in the second direction I. That is, the length direction of the howling 20 is the second direction I, and each howling 20 corresponds to the invalid mask regions 322.

The number of the at least one howling 20 can be set according to the number of mask pattern regions 321 of the metal mask 30. For example, assuming that the number of mask pattern regions 321 of the metal mask 30 is N and N is an integer larger than 1, then the number of the at least one howling 20 is larger than or equal to 1, and smaller than or equal to N−1. In some embodiments, the number of the at least one howling 20 is N−1.

With continued reference to FIGS. 3-5, each howling 20 span across the hollow region 11 of the frame 10 in the second direction I, and two ends of the howling 20 are connected to the frame 10. For example, referring to FIG. 5, grooves are provided in the frame 10 at the left and right sides of the hollow region 11, and two ends of the howling 20 are respectively and correspondingly inserted into the grooves in the frame 10 at the left and right sides of the hollow region 11. The howlings 20 are fixedly connected to the frame 10 by for example snapping, soldering, etc., and the howlings 20 correspond to the invalid mask regions 322.

The howlings 20 are configured to support the metal masks 30 without causing interference to the mask pattern regions 321 of the metal mask 30, so as to prevent the metal mask 30 from collapsing after two ends of the metal mask 30 along the first direction J are connected to the frame 10, improve the flatness of the metal mask 30, prevent the quality of the formed functional film layer from being affected, and thereby improve the percent of pass of the display panel.

It will be noted that a material of the frame 10, a material of the at least one howling 20, and a material of the metal masks 30 may be determined according to actual needs, as long as it is ensured that the frame 10, the at least one howling 20 and the metal masks 30 can be adsorbed by the magnetic absorption device.

In some embodiments, the material of the frame, the material of the at least one howling and the material of the metal masks are all Invar alloy which has a low coefficient of thermal expansion. In this way, the frame, the at least one howling and the metal masks may be magnetically adsorbed.

In some embodiments, the thickness of the mask body part 32 in the metal mask 30 can be set according to actual needs. For example, the thickness of the mask body part 32 in the metal mask 30 is 20 μm to 150 μm.

Figure 13A:
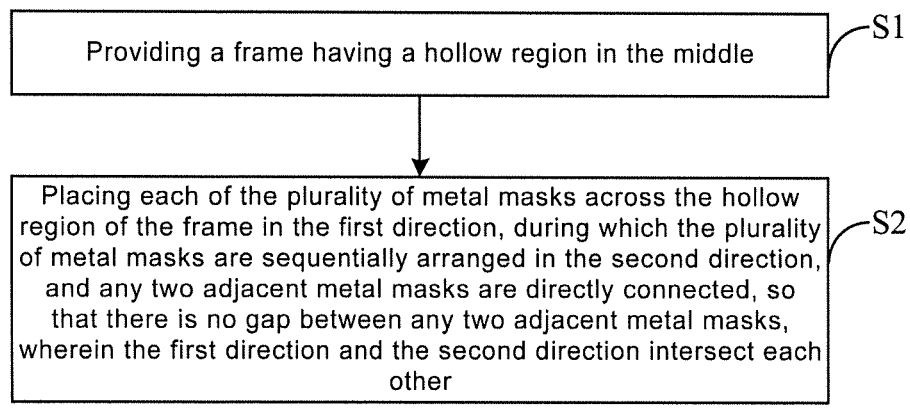
FIG. 13a is a flow chart of a method of manufacturing a metal mask plate according to some embodiments of the present disclosure.

Referring to FIG. 13a, some embodiments of the present disclosure provide a method of manufacturing a metal mask plate, which is used for manufacturing the metal mask plate as described in the above embodiments. The method of manufacturing a metal mask plate includes:

S1, providing a frame 10 having a hollow region 11 in the middle; and

S2, placing each of a plurality of metal masks 30 across the hollow region 11 of the frame 10 in a first direction J, during which the plurality of metal masks 30 are sequentially arranged in a second direction I, and any two adjacent metal masks 30 are directly connected so that there is no gap between any two adjacent metal masks 30. The first direction J and the second direction I intersect each other.

Each of the embodiments in this description is described in a progressive manner. As for the same or similar parts between the embodiments, reference may be made to each other. The description of each embodiment is focused on differences from other embodiments. In particular, as for embodiments of methods, since they are substantially similar to embodiments of structures, the descriptions are relatively simple, and reference may be made to part of the description of the structures for relevant information.

In the metal mask plate, structures of the metal masks 30 and the method in which any two adjacent metal masks 30 are directly connected may be structures and method described in the first method, or structures and method described in the second method.

In a case where the structures of the metal masks 30 and the method in which any two adjacent metal masks 30 are directly connected is the structures and method described in the first method, for example, of the plurality of metal masks 30, a single metal mask 30 has the structure as shown in FIG. 2a, and the remaining metal masks 30 have the structure as shown in FIG. 2b, and the plurality of metal masks 30 are sequentially arranged in the second direction I in a way as shown in FIG. 8 or 9. That is, the metal mask 30 includes two opposite connecting parts 31, and the two connecting parts 31 are located at two sides of the mask body part 32 in the second direction I. The connecting part 31 includes a body portion 311 and a single-stage step portion 312, a side of the body portion 311 is connected to the mask body part 32, and an opposite side of the body portion 311 is connected to the single-stage step portion 312. The single-stage step portion 312 of the connecting part 31 includes a step surface 313 intersecting with a thickness direction of the metal mask 30, and a step surface 313 of any one of the connecting parts 31 and a step surface 313 of a connecting part 31 of a metal mask 30 adjacent to the connecting part 31 are partially overlapped and connected to each other. In the second direction I, of the plurality of metal masks 30, the step surfaces 313 of the two connection portions 31 of a single metal mask 30 located in the middle of the hollow region 11 are disposed facing the same direction in the thickness direction of the metal mask 30, and the step surfaces 313 of the two connection portions 31 of the remaining metal masks 30 are disposed facing opposite directions in the thickness direction of the metal mask 30. In the second direction I, from the middle to both sides of the hollow region 11, of any two adjacent metal masks 30, a step surface 313 of a connecting part 31 of a metal mask 30 close to a side of the hollow region 11 is placed on a step surface 313 of a connecting part 31 of a metal mask 30 close to the middle of the hollow region 11.

Figure 14:
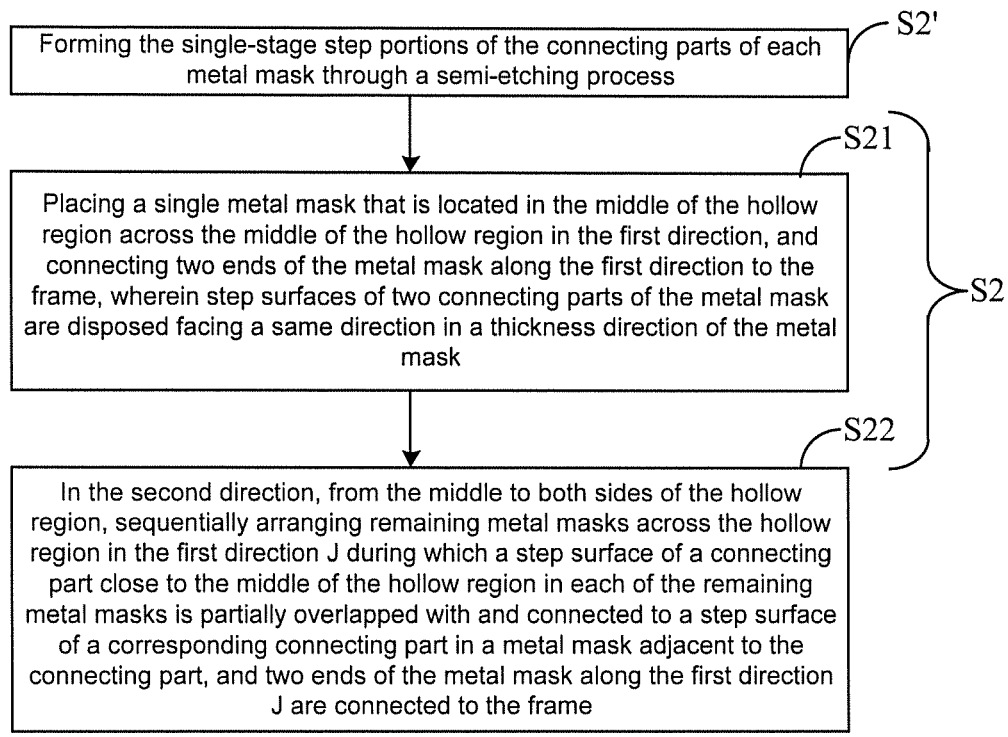

Based on this, referring to FIG. 14, in some embodiments, S2, placing each of a plurality of metal mask 30 across the hollow region 11 of the frame 10 in a first direction J, during which the plurality of metal masks 30 are sequentially arranged in a second direction I, and any two adjacent metal masks 30 are directly connected, includes:

Step S21, placing a single metal mask 30 that is located in the middle of the hollow region 11 across the middle of the hollow region 11 in the first direction J, and connecting two ends of the metal mask 30 along the first direction J to the frame 10, wherein step surfaces 313 of two connecting parts 31 of the metal mask 30 are disposed facing a same direction in a thickness direction of the metal mask 30; and Step S22, in the second direction, from the middle to both sides of the hollow region 11, sequentially arranging remaining metal masks 30 across the hollow region 11 in the first direction J during which a step surface 313 of a connecting part 31 close to the middle of the hollow region 11 in each of the remaining metal masks is partially overlapped with and connected to a step surface 313 of a corresponding connecting part 31 in a metal mask 30 adjacent to the connecting part 31, and two ends of the metal mask 30 along the first direction J are connected to the frame 10.

With continued reference to FIG. 14, in some embodiments, before "S2, placing each of a plurality of metal mask 30 across the hollow region 11 of the frame 10 in a first direction J, during which the plurality of metal masks 30 are sequentially arranged in a second direction I, and any two adjacent metal masks 30 are directly connected", the method further includes:

S2', forming the single-stage step portions 312 of the connecting parts of each metal mask 30 through a semi-etching process.

In some embodiments, two adjacent metal masks 30 may be connected by a plurality of means, for example, by bolting, or by adhesive bonding, or by soldering. In some examples, two adjacent metal masks 30 are joined by soldering. In this way, the connection reliability and robustness of the two adjacent metal masks 30 may be improved. In particular, when the metal mask plate is placed in a chemical reagent for cleaning, the two adjacent metal masks may be prevented from being separated due to influence of the chemical reagent.

Figure 13B:
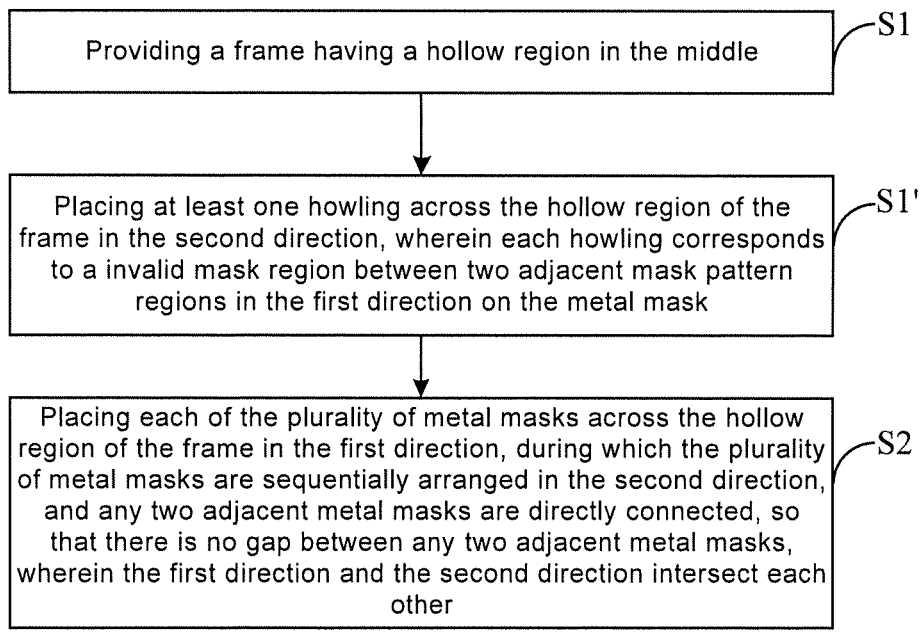
FIG. 13b is a flow chart of another method of manufacturing a metal mask plate according to some embodiments of the present disclosure.

Referring to FIG. 13b, in some embodiments, before "S2, placing each of a plurality of metal mask 30 across the hollow region 11 of the frame 10 in a first direction J, during which the plurality of metal masks 30 are sequentially arranged in a second direction I, and any two adjacent metal masks 30 are directly connected", the method further includes:

S1', placing at least one howling 20 across the hollow region 11 of the frame 10 in the second direction I, wherein each howling 20 corresponds to a invalid mask region 322 between two adjacent mask pattern regions 321 in the first direction J on the metal mask 30.

In the description of the above embodiments, specific features, structures, materials or characteristics may be combined in any suitable manner in any one or more embodiments or examples.

The foregoing descriptions are merely some implementation manners of the present disclosure, but the protection scope of the present disclosure is not limited thereto, and the changes or replacements that any person skilled in the art can easily think of in the technical scope disclosed by the present disclosure should be within the protection scope of the present disclosure. Therefore, the protection scope of the present disclosure shall be subject to the protection scope of the claims.

What is claimed is:

1. A metal mask, comprising:
   a mask body part; and
   two connecting parts disposed at opposite sides of the mask body part, wherein each connecting part comprises:
   a body portion a side of which is connected to the mask body part; and
   a single-stage step portion connected to an opposite side of the body portion, wherein
   a thickness of the single-stage step portion is smaller than a thickness of the body portion;
   the single-stage step portion comprises a step surface, and the step surface is an inclined surface, and an angle between the step surface and an axis extending along a thickness direction of the metal mask is less than 90° and greater than 0°; the single-stage step portion further comprises a rear end close to and connected to the body portion and a front end away from the body portion; a thickness of the rear end is less than a thickness of the front end; and step surfaces of the two connecting parts are disposed facing a same direction in the thickness direction of the metal mask;
   a height of the front end of the single-stage step portion in the thickness direction of the metal mask is one third to two thirds of a thickness of the mask body part; and
   a width of each connecting part is 0.5 mm to 3 mm.

2. A metal mask plate, comprising:
   a frame, a middle region of which is a hollow region, and
   a plurality of metal masks, each metal mask being the metal mask according to claim 1, each metal mask spanning across the hollow region in a first direction, and two ends of each metal mask along the first direction being connected to the frame, wherein
   the plurality of metal masks are sequentially arranged in a second direction, and any two adjacent metal masks are directly connected, so that there is no gap between any two adjacent metal masks; and the first direction and the second direction intersect each other.

3. The metal mask plate according to claim 2, wherein step surfaces of two adjacent connecting parts of any two adjacent metal masks are partially overlapped and connected to each other.

4. The metal mask plate according to claim 3, wherein there is a distance between a front end of any connecting part and a rear end of a connecting part of a metal mask adjacent to the connecting part.

5. The metal mask plate according to claim 3, wherein a width of an overlapping area between a step surface of any connecting part and a step surface of a connecting part of a metal mask adjacent to the connecting part is 20% to 80% of a width of the connecting part.

6. The metal mask plate according to claim 2, wherein in the second direction, a side surface of any one of the plurality of metal masks is opposite to and connected to a side surface of another one of the plurality of metal mask adjacent to the side surface.

7. The metal mask plate according to claim 2, wherein in the first direction, each metal mask comprises at least two mask pattern regions and at least one invalid mask region, and each invalid mask region is provided between two adjacent mask pattern regions of the metal mask; and
   the metal mask plate further comprises at least one howling for supporting the plurality of metal masks, and each howling spans across the hollow region of the frame along the second direction and corresponds to a corresponding one of the at least one invalid mask region.

8. A method of manufacturing a metal mask plate, comprising:
providing the metal mask plate of claim 2;
placing each of the plurality of metal masks of the metal mask plate across the hollow region of the frame of the metal mask plate in the first direction, the two ends of each metal mask along the first direction being connected to the frame; and
arranging the plurality of metal masks sequentially in the second direction, any two adjacent metal masks being directly connected, so that there is no gap between any two adjacent metal masks, wherein the first direction and the second direction intersect each other.

9. The method of manufacturing the metal mask plate according to claim 8, wherein step surfaces of connecting parts of any two adjacent metal masks are partially overlapped and connected to each other; and in the second direction, from a middle to both sides of the hollow region, of any two adjacent metal masks, a step surface of a connecting part of a metal mask close to a side of the hollow region is placed on a step surface of a connecting part of a metal mask close to the middle of the hollow region; and
placing each of the plurality of metal masks across the hollow region of the frame in the first direction, arranging the plurality of metal masks sequentially in the second direction, any two adjacent metal masks being directly connected, comprises:
placing a single metal mask that is located in the middle of the hollow region across the middle of the hollow region in the first direction, and connecting two ends of the metal mask along the first direction to the frame, wherein step surfaces of two connecting parts of the metal mask are disposed facing a same direction in a thickness direction of the metal mask; and
in the second direction, from the middle to both sides of the hollow region, sequentially arranging remaining metal masks across the hollow region in the first direction, during which a step surface of a connecting part close to the middle of the hollow region in a metal mask and a step surface of a corresponding connecting part in a metal mask adjacent to the connecting part are partially overlapped and connected, and two ends of the metal mask along the first direction are connected to the frame.

* * * * *